(12) United States Patent
Park et al.

(10) Patent No.: US 7,065,108 B2
(45) Date of Patent: Jun. 20, 2006

(54) METHOD OF WAVELENGTH TUNING IN A SEMICONDUCTOR TUNABLE LASER

(75) Inventors: Sahng Gi Park, Daejon-Shi (KR); Moon Ho Park, Daejon-Shi (KR); Ji Myon Lee, Daejon-Shi (KR); Su Hwan Oh, Busan-Shi (KR); Kyong Hon Kim, Incheon-Shi (KR)

(73) Assignee: Electronics and Telecommunications Research Institute (KR)

( * ) Notice: Subject to any disclaimer, the term of this patent is extended or adjusted under 35 U.S.C. 154(b) by 300 days.

(21) Appl. No.: 10/744,457

(22) Filed: Dec. 22, 2003

(65) Prior Publication Data

US 2004/0136415 A1    Jul. 15, 2004

(30) Foreign Application Priority Data

Dec. 24, 2002   (KR) .................... 10-2002-0083755
Apr. 2, 2003    (KR) .................... 10-2003-0020673

(51) Int. Cl.
*H01S 3/10*    (2006.01)
(52) U.S. Cl. .......................... 372/20; 372/99
(58) Field of Classification Search ............. 372/20
See application file for complete search history.

(56) References Cited

U.S. PATENT DOCUMENTS 4,364,633 A * 12/1982 Verber et al. .............. 385/3

| 4,896,325 A | 1/1990 | Coldren |
| 5,013,113 A * | 5/1991 | Soref ............ 385/17 |
| 5,325,392 A | 6/1994 | Tohmori et al. |
| 6,141,360 A | 10/2000 | Kinugawa et al. |

OTHER PUBLICATIONS

Vijaysekhar Jayaraman, et al., Theory, Design, and Performance of Extended Tuning Range Semiconductor Lasers with Sampled Gratings, IEEE Journal of Quantum ELectronics, vol. 29, No. 6, Jun. 1993.
R.C. Alferness, et al., Grating-assisted InGaAsP/InP vertical codirectional coupler filter, AT&T Bell Laboratories, Holmdel, New Jersey, published Sep. 5, 1989.
W. Idler, et al., Y Laser With 38 nm Tuning Range, Electronics Letters, Nov. 21, 1991, vol. 27, No. 24.

* cited by examiner

*Primary Examiner*—Armando Rodriguez
*Assistant Examiner*—Dung Nguyen
(74) *Attorney, Agent, or Firm*—Blakely Sokoloff Taylor & Zafman

(57) ABSTRACT

A tunable semiconductor laser including a Fabry-Perot filter and an electrode array is disclosed. The propagation direction of the light beam in the cavity can be consecutively shifted applying electric field or current to the electrode and tuning can consecutively performed over the wide wavelength band by the consecutive shift of the angle of the intra cavity laser beam.

15 Claims, 12 Drawing Sheets

METHOD OF WAVELENGTH TUNING IN A SEMICONDUCTOR TUNABLE LASER

FIELD OF THE INVENTION

The present invention relates to a tunable semiconductor laser, and more particularly, to a semiconductor laser that allows a very wide range of wavelength tuning over the optical fiber communication band.

DESCRIPTION OF THE PRIOR ART

An explosive increase of information in the 80's and 90's has pushed the demand for an explosive increase of communication network capacity that requires many channels over a wide frequency range. The tunable semiconductor laser is a critical component in a wide variety of wavelength division multiplexing (WDM) and packet switching architectures. The network capacity in such systems increases in accordance with the number of wavelength channels accessible by the tunable laser transmitters.

The tunable semiconductor lasers are implemented, in most cases, by two different ways, non-monolithic and monolithic integrations.

The non-monolithic technique often employs the schemes of tunable solid state or dye lasers, which consist of active materials and tunable filters in the cavity mirrors. A typical example of non-monolithic external cavity tunable semiconductor laser consists of a piece of semiconductor that has a facet mirror at one end and a diffraction grating. The light beam oscillates between the facet mirror and the diffraction grating through the antireflection-coated facet, where the diffraction grating is rotated for wavelength tuning. Such a device provides a single-mode tuning range of nearly 100 nm and a power of several milliwatts. In the research laboratory, this technique has demonstrated a tuning range of 240 nm at 1550 nm.

Unfortunately, this external cavity approach must discard many of the conventional advantages of the semiconductor laser, such as tuning speed, small size, mass producibility, low cost, and integrability. These drawbacks provide a strong motivation for monolithic tunable semiconductor lasers.

The early types of monolithic tunable semiconductor lasers are DFB (distributed feedback) and DBR (distributed brag reflector) lasers. Both DBR and multisection DFB tunable lasers are limited in tuning range by the fundamental problem that the fractional wavelength change $\Delta\lambda/\lambda$ cannot exceed the effective refractive index change $\Delta\mu/\mu$ in the grating section of the device. That is, the maximum tuning range is less than 10 nm. Clearly, a clever scheme is required to exceed the limit of this small tuning range.

In early 90's, several groups have proposed and demonstrated several prospective tuning schemes. The first one is the Y-cavity laser, in which extended tuning can be accomplished by using a slight modification of Mach-Zender interferometer. This device has exhibited tuning of 38 nm and has the advantage of simple fabrication that requires no gratings, but it has a serious drawback of a low side mode suppression ratio (SMSR), 15~20 dB, which comes from the simple fabrication process and tuning scheme. The second one is the tunable laser that has a tunable intra-cavity grating-assisted co-directional coupler (GACC) filter. The tuning range depends on $\Delta\mu/(\mu_1-\mu_2)$ rather than $\Delta\mu/\mu$, where $\mu_1, \mu_2$ are the effective refractive indexes of the two coupled optical waveguides. Although showing an impressive tuning range of 57 nm, this device has a primary limitation that increasing filter tunability by reducing $(\mu_1-\mu_2)$ degrades the side mode suppression ratio. It has also been pointed out that the GACC has a very narrow design window to obtain an acceptable SMSR.

Up to the present, the most successful device available commercially is the semiconductor laser using a sampled grating (SG) DBR (U.S. Pat. No. 4,896,325). The sampled grating DBR provides periodic reflection maxima on the wavelength spectrum. Tuning is accomplished by shifting reflection peaks of two sampled gratings having a slightly different period from each other. Despite many advantages of SGDBR laser compared to other tuning schemes, it still has some fundamental shortcomings. The wavelength tuning is accomplished not continuously but, so called, quasi-continuously, which means that shifting from one wavelength to another arbitrary wavelength is very complicate and takes time. A user may tune to the only wavelengths defined by the provider of the device. As a slight modification to SGDBR laser, a new scheme of superstructure grating (SSG) DBR laser has been introduced, which uses chirped gratings instead of sampled gratings to produce the periodic reflection maxima (U.S. Pat. No. 5,325,325). This device not only shares the same problem of quasi-continuous tuning as SGDBR laser, but it also suffers from the fabrication difficulty requiring E-beam lithography, which may be a serious obstacle for mass production.

SUMMARY OF THE INVENTION

Accordingly, in order to solve the above-mentioned problems, one object of the present invention is to provide a new scheme by which continuous tuning can be accomplished over a wide wavelength band for the semiconductor lasers.

Other object of the present invention is to remove some drawbacks of the current non-monolithic and monolithic semiconductor lasers and take their advantages thereof.

The further still other object of the present invention is to provide a tuning scheme over a wide wavelength range being capable of immediately applied to the optical fiber communication devices.

In order to accomplish the above-mentioned objects, a tunable semiconductor laser is comprised of a curve-shaped waveguide formed on a substrate for guiding light beam, an active area formed on a portion of the waveguide for generating the light beam, an electrode array formed at one side of the active area for changing the propagation direction of the light beam by applying electric field or currents to a predetermined portion of the waveguide, a Fabry-Perot filter for filtering the wavelength of light and a curved mirror for reflecting the light passed through the Fabry-Perot filter.

The Fabry-Perot filter is an element filtering out and transmitting through a band of wavelength according to an incident angle, and the wavelength of the light transmitted through this filter is related to the incident angle of the filter by the equation, $\lambda=\lambda_0 \cos\theta$. Here, $\lambda_0$ is the wavelength of the light incident vertically to the filter.

The Fabry-Perot filter is designed to give a narrow spectrum bandwidth enough to allow lasing on single cavity mode with an acceptable SMSR. The curved mirror is designed to reflect back the transmitted light through the Fabry-Perot filter along the same path as that of the incoming light. In order to remove the light reflected from the front surface of the Fabry-Perot filter, the waveguide of laser cavity is bended by an appropriate angle and radius of curvature.

The electrode array can continuously change the propagation direction of the light beam in the cavity by applying electric field or currents. The waveguide under the electrode array is fanned out to allow the shift of propagation direction of light.

DESCRIPTION OF THE PREPERRED EMBODIMENT

Hereinafter, the embodiments of the present invention will be explained with reference to the accompanying drawings. However, the embodiment of the present invention can be changed into a various type, and it should be not understood that the scope of the present invention is limit to the following embodiments. The embodiments of the present invention are provided in order to explain the present invention to those skilled in the art.

First Embodiment

Figure 1:
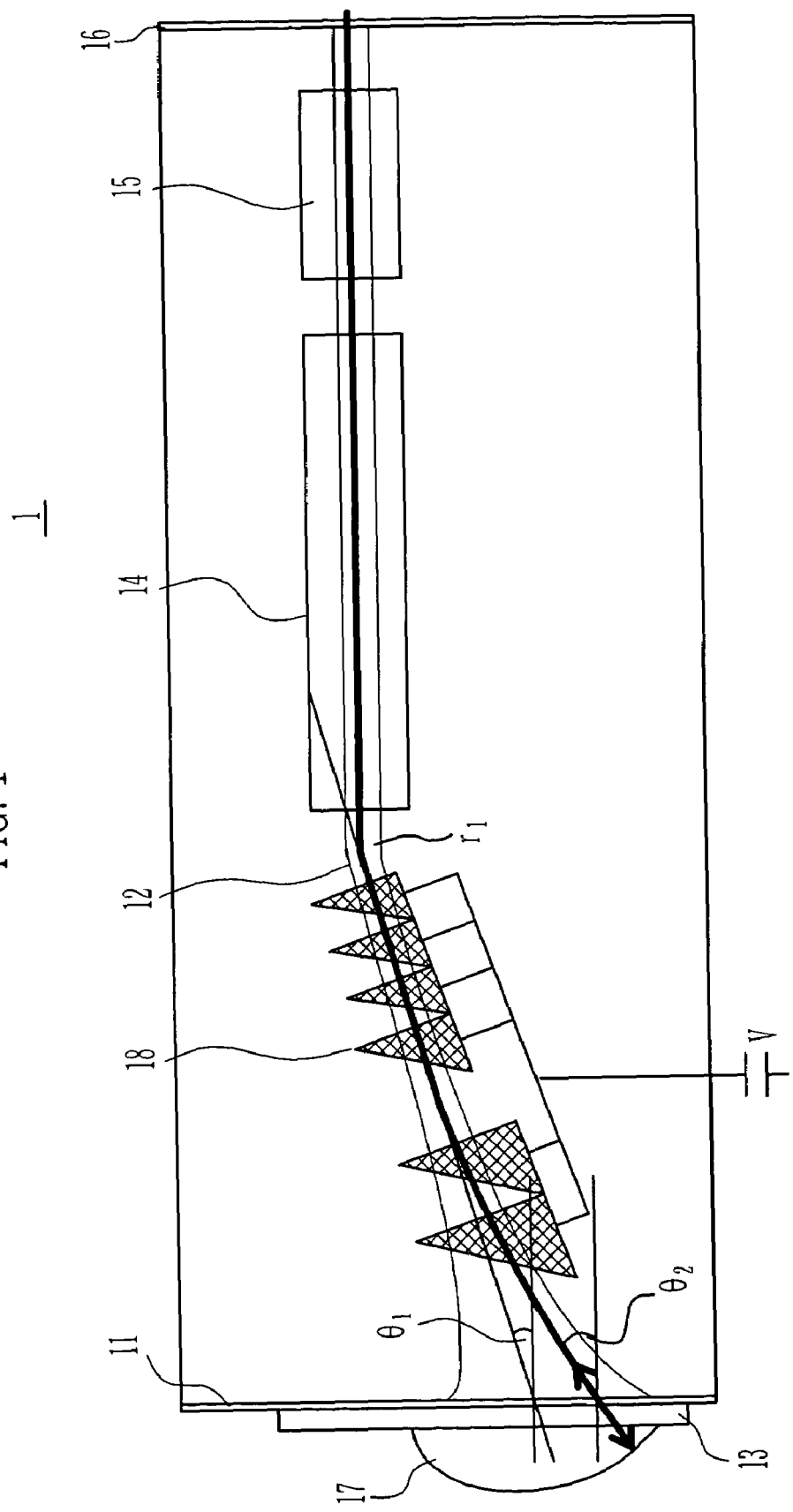
FIG. 1 shows a tunable semiconductor laser 1 according to the preferred embodiment of the present invention.

FIG. 1 shows a tunable semiconductor laser 1 according to a first embodiment of the present invention. The tunable semiconductor laser 1 comprises a semiconductor part and a dielectric part. The semiconductor part includes an active area 14 and an electrode array 18 of the common semiconductor laser. It can include a phase control area 15 and an output mirror 16. The dielectric part includes a Fabry-Perot (FP) filter 13 and a curved mirror 17. Antireflection thin film 11 can be also included between the Fabry-Perot filter 13 and a facet of semiconductor. The antireflection thin film 11, the Fabry-Perot filter 13, and the curved mirror 17 can be manufactured by using dielectric material and growing it on one facet of the semiconductor block.

The Fabry-Perot filter 13 is an element of filtering an optical beam having a different wavelength according to an incident angle, and the wavelength of the light transmitted through this filter is related to the incident angle of the filter by the equation (1).

$$\lambda = \lambda_0 \cos\theta \quad (1)$$

Here, $\lambda_0$ is the wavelength of the light incident vertically to the filter. The material of Fabry-Perot filter 13 is not specially limited and can be variously implemented if it can perform the function of the above-mentioned filter. For example, it can be manufactured by using $TiO_2/SiO_2$ thin films by multiple periods of 180 nm/200 nm. In addition, it can also be manufactured by using a silicon oxide film and a silicon nitride ($SiN_x$) film.

The Fabry-Perot filter 13 is designed to give a narrow spectrum bandwidth enough to allow lasing on single cavity mode with an acceptable SMSR. The curved mirror 17 is designed to reflect back the transmitted light through the Fabry-Perot filter 13 along the same path as that of the incoming light. In order to remove the light reflected from the front surface of the Fabry-Perot filter 13, the waveguide of laser cavity is bended by an appropriate angle and a radius of curvature.

The curved mirror 17 can be formed together with the Fabry-Perot filter 13 by a continuous process, and any available technique can be used in the spherical shape of the mirror. The curved mirror 17 reflects the light along the same path of the incident light. The same material used for the Fabry-Perot filter 13 can be used for the curved mirror.

The light beam is guided by the waveguide 12, which is bended by an appropriate angle $\theta_1$ and radius of curvature $r_1$. Specific values of $\lambda_1$, $r_1$ can be determined by the core and the cladding materials of the waveguide and the angle $\theta_1$ must be large enough to remove the reflected light from the front surface of the Fabry-Perot filer 13 and the radius of curvature $r_1$ also must be large enough to minimize the loss of the light guided by the bending. For example, it is preferable that the angle $\theta_1$ is larger than the critical angle that the reflected light from the Fabry-Perot filter 13 escapes out of the waveguide. In case where the waveguide is composed of InGaAsP core and InP cladding and the index difference is $\Delta n = 0.189$, the critical value is $9.7°$.

The electrode array 18 can continuously change the propagation direction of the light beam in the cavity by applying electric field or currents. That is, the incident angle and the emergent angle of one electrode (for example, one triangle) of the electrode array 18 are different from each other, and the inside of the triangle is designed to have a refractive index different from that of the outside thereof by applying the electric field or the currents. By this principle, the propagation direction of the light beam can be changed. For example, the electrode array 18 can be a triangle, a trapezoid, or a polygon having two sides that are not parallel. The waveguide under the electrode array is fanned out to allow the shift of propagation direction of light. This will be explained later in detail. However, if the above-mentioned principle can be applied to the structure, the shape of the unit electrode in the electrode array 18 can be changed variously.

Figure 2A:
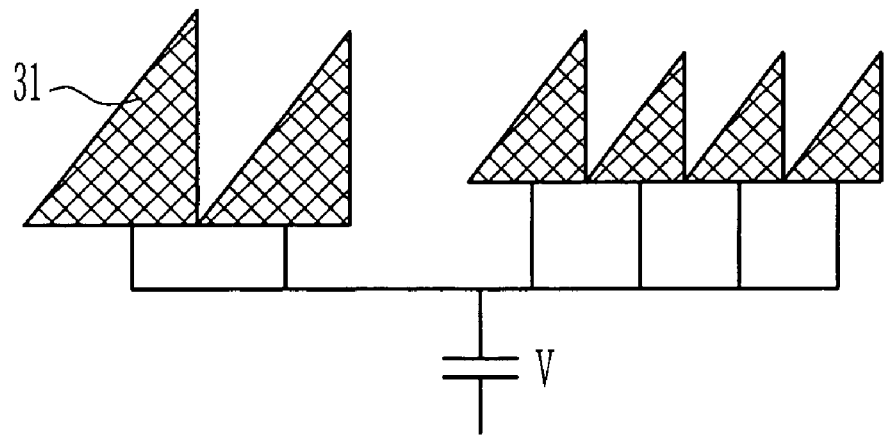
FIGS. 2A and 2B shows an example of an electrode array in FIG. 1.
Figure 2B:
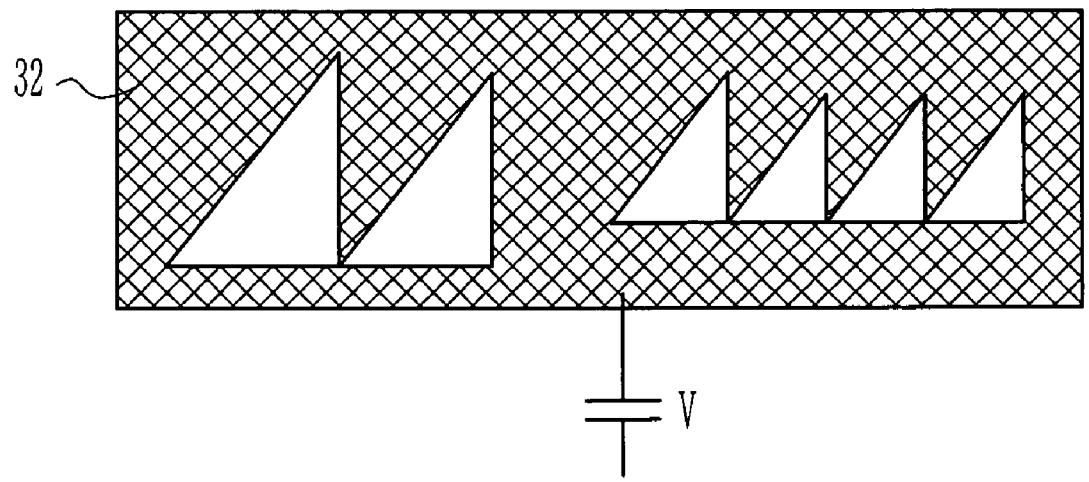

FIGS. 2A and 2B show the embodiments of the electrode array. FIG. 2A shows the triangular electrode 31 and FIG. 2B shows the reversed image of FIG. 2A. In FIGS. 2A and 2B, the light beams are shifted in opposite direction to each other. The electrode having various shapes such as trapezoid as well as the triangle can be designed, and such designed shapes should be included in the present invention.

On the other hand, the active area 14, the phase control area 15, and the output mirror 16 constituting the semiconductor part are components used in the common semiconductor laser and thus the explanation thereof will be omitted for convenience.

Figure 3A:
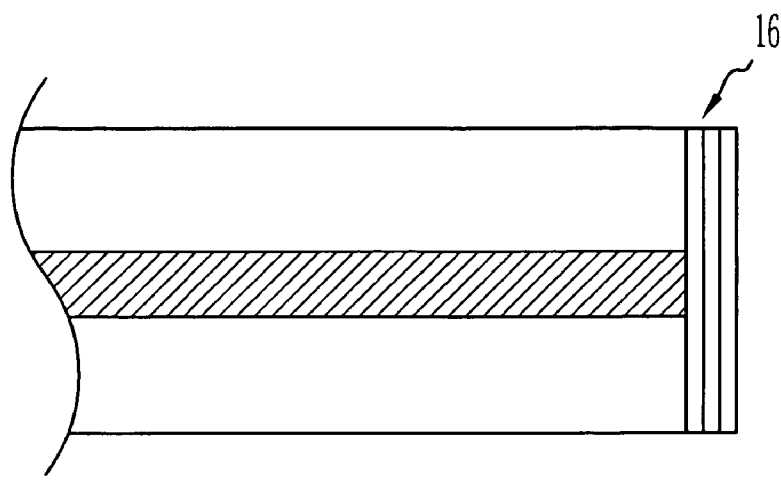
FIGS. 3A, FIG. 3B, FIG. 3C show examples of manufacturing an output mirror in FIG. 1.
Figure 3B:
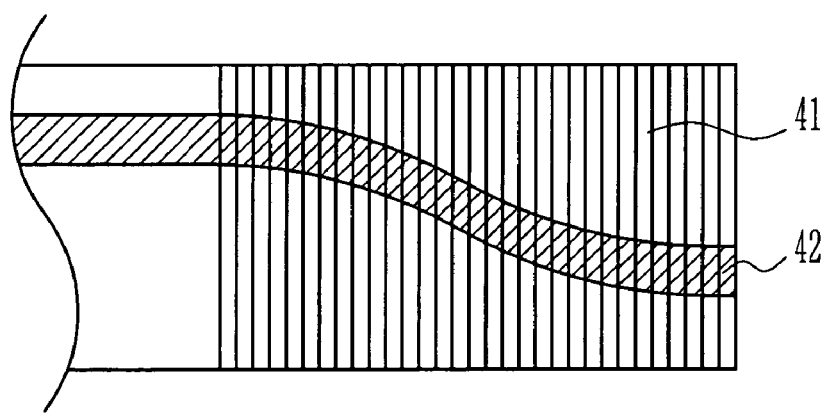
Figure 3C:
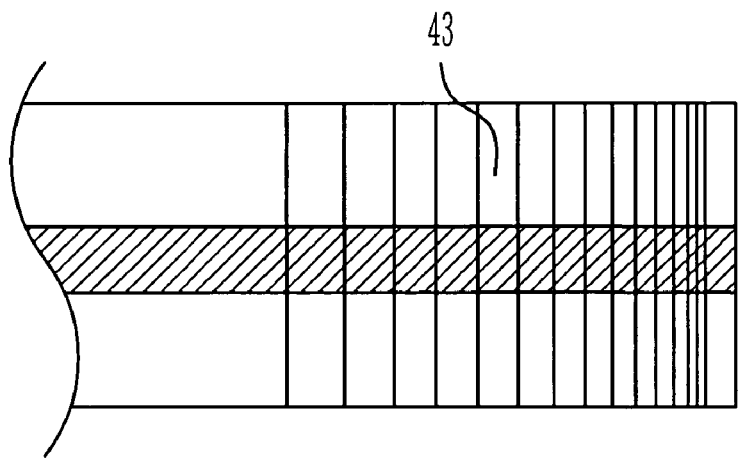

The output mirror 16 of the laser cavity can be formed at one facet of the semiconductor laser of FIG. 1, and can be formed in various methods designed specially to ensure the enough wide bandwidth. Also, in case where a semiconductor optical amplifier (SOA) is integrated with the semiconductor laser, various kinds of the output mirrors 16 can be introduced, in stead of the simple facet. FIGS. 3a, 3b, and 3c show the examples of output mirror 16 at the end of the semiconductor laser.

FIG. 3A shows a dielectric mirror 16 coated at one facet of the semiconductor laser.

FIG. 3B shows a uniform grating engraved in the curved waveguide 42 and FIG. 3C shows a chirped grating 43 engraved on a straight waveguide, both of which are deigned to cover the whole bandwidth of the tuning spectrum. As expected from the figures, the structure of FIG. 3B has an advantage of easy process using holographic lithography, and the structure of FIG. 3C has advantages of the simple straight waveguide and its smaller loss, but has a shortcoming that must use a slow process of E-Beam lithography.

Hereinafter, the operating principle of the tunable semiconductor laser 1 will be explained with reference to FIG. 1 in detail.

First, the light beam generated at the active area 14 is guided along with the waveguide 12. In case where the waveguide 12 is bended by the angle $\theta_1$ of 15°, the angle $\theta_2$ required for the tuning of 70 nm is calculated to about 22.7°, and thus the angle, 7.7° is enough to tune 70 nm of wavelength. Supposed that the core of the waveguide 12 is composed of the material of InGaAsP having the refractive index of n=3.359 and the cladding thereof is composed of InP and the index difference between the core and the cladding is Δn=0.189, then the critical angle is about 9.7°. The reflected light from the Fabry-Perot filter is escaped out of waveguide and the bended angle $\theta_1$ (15°) of the waveguide is enough larger than the critical angle.

On the other hand, supposed that the largest index change is 0.516%=(1558 nm–1550 nm)/1550 nm at the highest electric current, the propagation angle shift is calculated to Δθ=0.2965° each time passing one electrode through a hypotenuse of the triangle having the angle of 45°. The number of the electrodes for the shift of 7.7° is 26 and, in case where the height of the first triangle is 2 μm, the total length of the electrodes is 315 μm and the height of the last triangle is 57 μm by the computer calculation. These values are capable of implementing by the semiconductor process.

Next, the shifted light beam is incident to the Fabry-Perot filter 13. The Fabry-Perot filter 13 is the element of filtering the different wavelength according to the incident angle. The wavelength of the light beam according to the incident angle of the Fabry-Perot filter 13 is as follows:

$$\lambda = \lambda_0 \cos \theta$$

Here, $\lambda_0$ is the wavelength of the light beam incident vertically to the filter.

The light beam having the wavelength selected as mentioned above is reflected back along the path equal to that of the incident light by the spherical shape of the dielectric mirror 13. By this method, the laser in the cavity oscillates between the output mirror 16 and the curved mirror 13.

Figure 4:
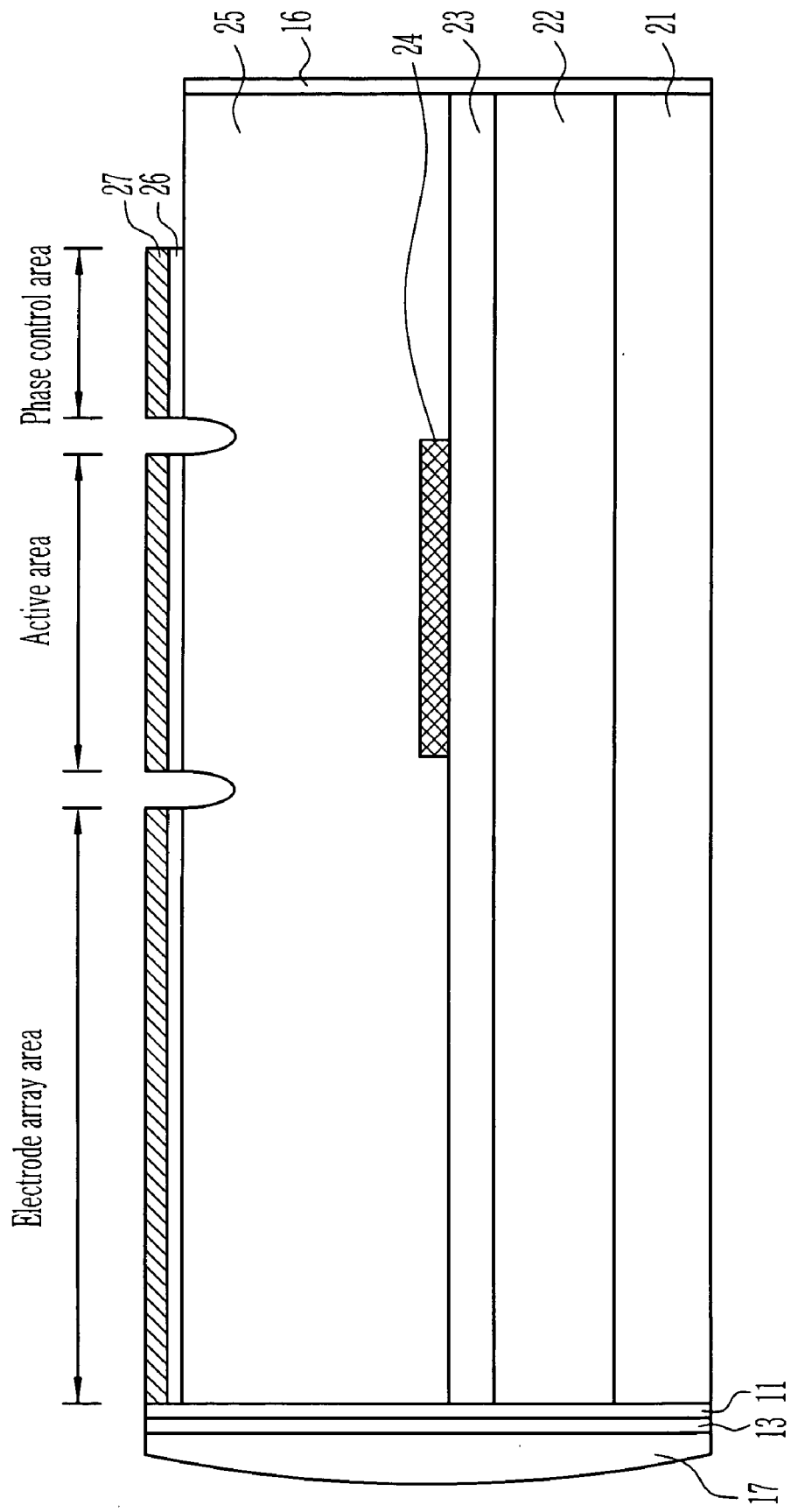
FIG. 4 is a cross sectional view illustrating an example of actually implementing the tunable semiconductor laser in FIG. 1.

Hereinafter, an example of manufacturing the tunable semiconductor laser 1 according to a preferred embodiment of the present invention will be explained. FIG. 4 is a cross sectional view of the semiconductor laser of FIG. 1 and shows a cross section bended along with the waveguide.

First, an n-InP buffer layer 22 is grown on the n-InP substrate 21 by a thickness of, for example, 3000 Å, and then a waveguide 23 and a multiple quantum well (MQW) active layer 24 are grown on the buffer layer consecutively. The waveguide 23 is a mono-layer having a thickness of 2000–4000 Å and using quaternary such as InGaAsP, and the active layer 24 is composed of a multiple quantum well structure using the quaternary such as InGaAsP and has a thickness of 2000–4000 Å. Next, the active layer 24 is patterned by using a series of lithography and etching processes and then the waveguide 23 is also patterned with the bended structure.

Subsequently, a InP P-cladding layer 25 and a P-InGaAs layer 26 for an ohmic contact are deposited and then ion injection process is performed in order to isolate electrically the waveguide area from the surrounding area.

Next, the electrode array and the active area are separated and then Pi/Pt/Au films are deposited by thicknesses of 200/200/3000 Å, respectively, to form a metal electrode 27. The kind of metal being capable of forming the electrode array is not specially limited and can be implemented variously. For example, gold (Au) can be deposited by a thickness of 100–200 nm.

Next, the Fabry-Perot filter 13 can be mounted on one facet of the laser after performing the all the processes of the semiconductor part. Preferably, an antireflection thin film 11 is formed on the facet. And then the curved mirror 13 is formed on the Fabry-Perot filter 13, which can be manufactured by the method such as high power laser cutting or wet etching after patterning by using the lithography. The curved mirror is also manufactured with a spherical shape along the vertical direction.

Second Embodiment

Figure 5:
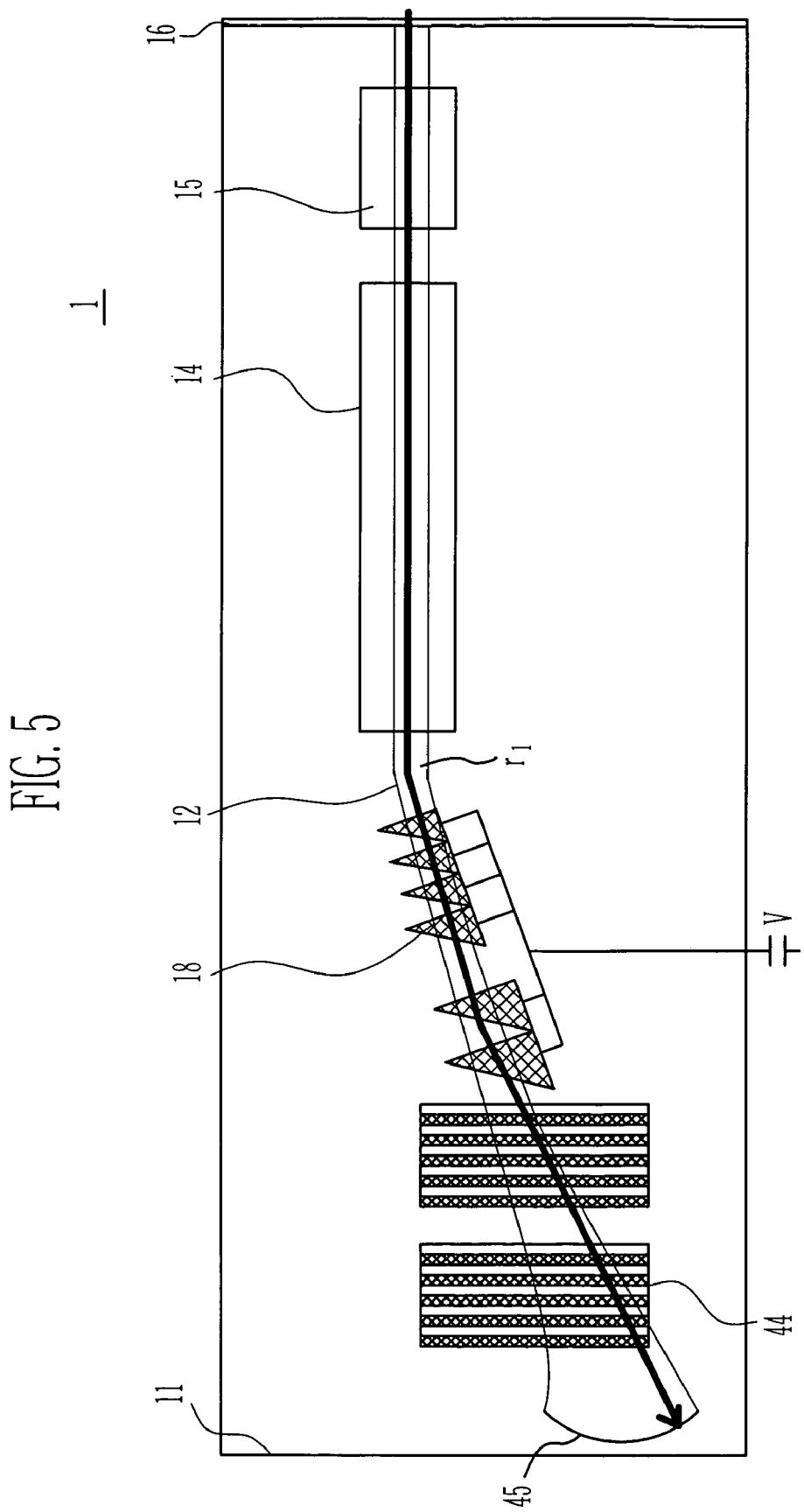
FIG. 5 is an example that a Fabry-Perot filter and a curved mirror are formed in the semiconductor part in FIG. 1.
Figure 6:
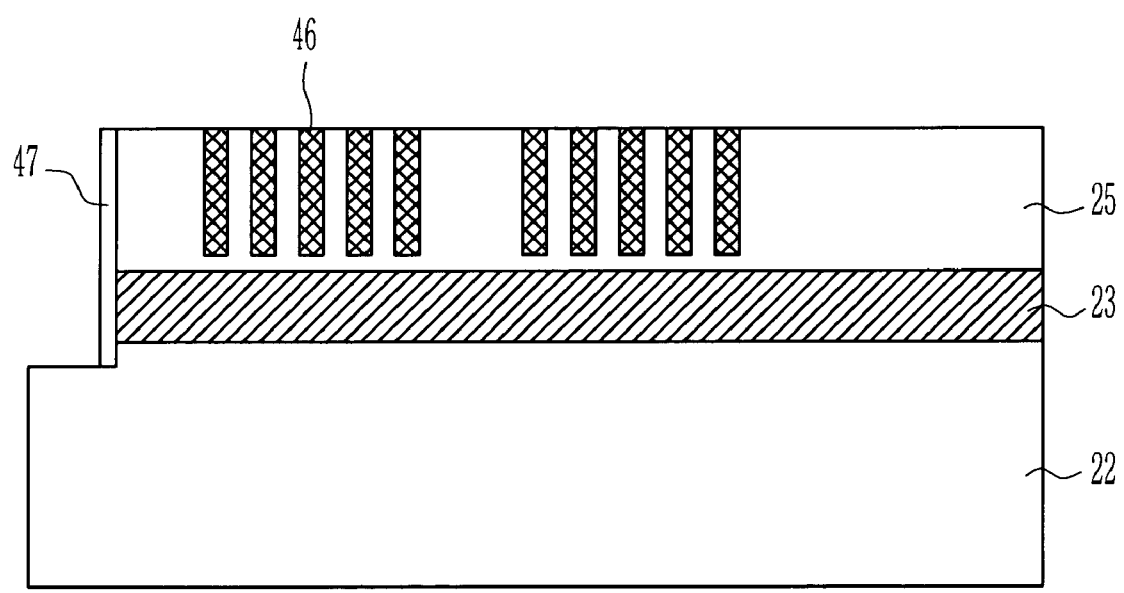
FIG. 6 is a cross sectional view of the curved mirror and the Fabry-Perot filter.

FIG. 5 shows the tunable semiconductor laser 1 according to the second embodiment of the present invention. The difference from the first embodiment is that both the Fabry-Perot filter and the curved mirror are monolithically manufactured in the semiconductor part. FIG. 6 is a cross sectional view of the tunable semiconductor laser in FIG. 5.

In this case, the fabrication is much easy and the radius and the center of curvature of the spherical mirror can be accurately adjusted by the lithography process.

Referring to FIG. 6, the Fabry-Perot filter (44 of FIG. 5) is formed by periodically engraving the grooves having a specific width in the waveguide 23 and filling them with the material (46 of FIG. 6) having the refractive index different from that of the cladding or the core of the waveguide. For example, the grooves of few μm are formed in the InP cladding layer 25 and material (for example, a dielectric material such as a silicon nitride film or a silicon oxide film) having the refractive index different from that of the cladding layer 25 is filled in the grooves. The depth, the width, and the number of the grooves are variously selected according to the characteristics of the filter and are not specially limited. In addition, the material filling the groove can be variously selected according to the characteristics of the process and any material is included in the present invention.

In case of filling the silicon nitride film in the groove of the Fabry-Perot filter (44 of FIG. 5), the thickness (width) of the InP cladding layer is 170–200 μm, and the thickness of the silicon nitride film is about 300 nm. When defining one InP cladding layer and one silicon nitride film as a pair, 5–10 pairs are successively arranged to form a front or back mirror of the Fabry-Perot filter and two mirrors are spaced from each other with a predetermined interval. The predetermined interval is designed to perform the function of the Fabry-Perot filter, and can be set to, for example, half wavelength or 1.5 times the half wavelength.

The curved mirror 47 in FIG. 6 can be formed on the waveguide 23 by using the lithography and etching processes and depositing the gold or multi-layers of dielectric material.

Hereinafter, the example of manufacturing the tunable semiconductor laser 1 according to the second embodiment of the present invention will be explained with reference to FIGS. 7A to 13B.

Figure 7A:
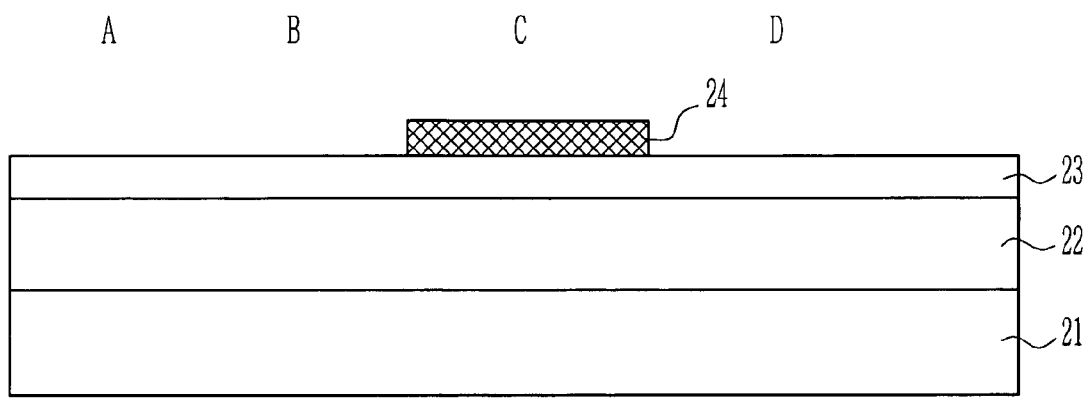
FIGS. 7A to 13B show the process of manufacturing the tunable semiconductor laser according to the embodiment of the present invention.
Figure 7B:

Referring to FIGS. 7A and 7B, an n-InP buffer layer 22 having a thickness of 3000 Å is grown on an n-InP substrate 21 and then a core layer 23 having a thickness of 2000–4000

Å is grown on the buffer layer by using quaternary such as InGaAsP. And then, multiple quantum wells of active layer 24 composed of, for example, the material of InGaAsP is consecutively formed by a thickness of 2000–4000 Å. Then, the active area having the bended structure is formed by using an active area mask shown in FIG. 7b. The detail process can use the common lithography and etching processes.

Figure 8A:
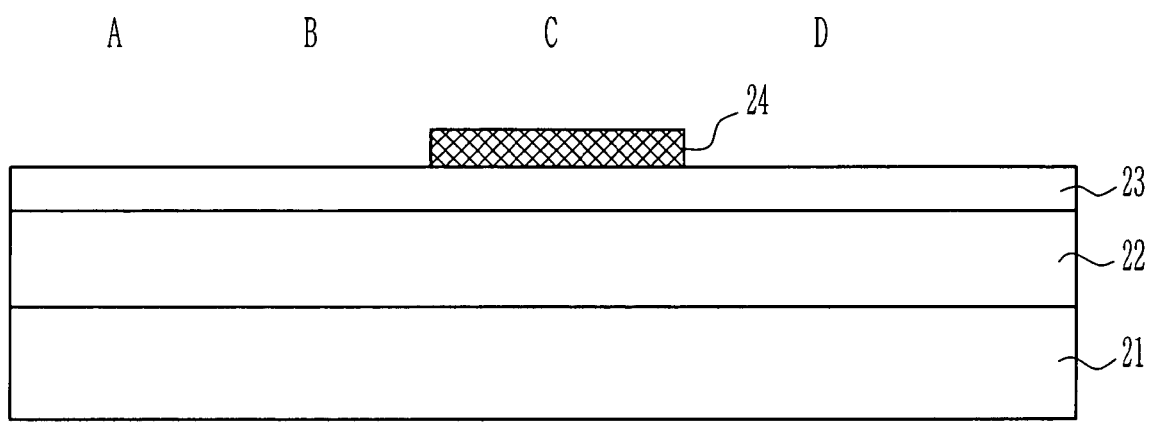
Figure 8B:

Referring to FIGS. 8A and 8B, the core layer 23 is patterned by using the lithography process to define the core area of the waveguide. As shown in FIG. 8b, it has the shape designed to form the Fabry-Perot filter and the curved mirror near the end of the waveguide.

Figure 9A:
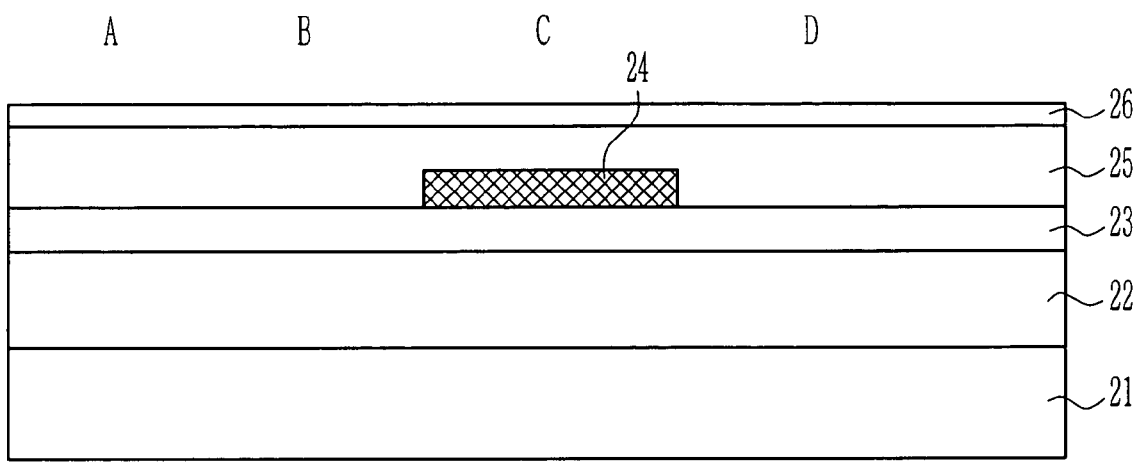
Figure 9B:

Referring to FIGS. 9A and 9B, a P-cladding layer 25 of the InP material is formed over all the structure by a thickness of about 2 μm and then a P-InGaAs 26 layer for ohmic contact is grown theron. Next, ion injection process is performed by using the mask of FIG. 9B.

Figure 10A:
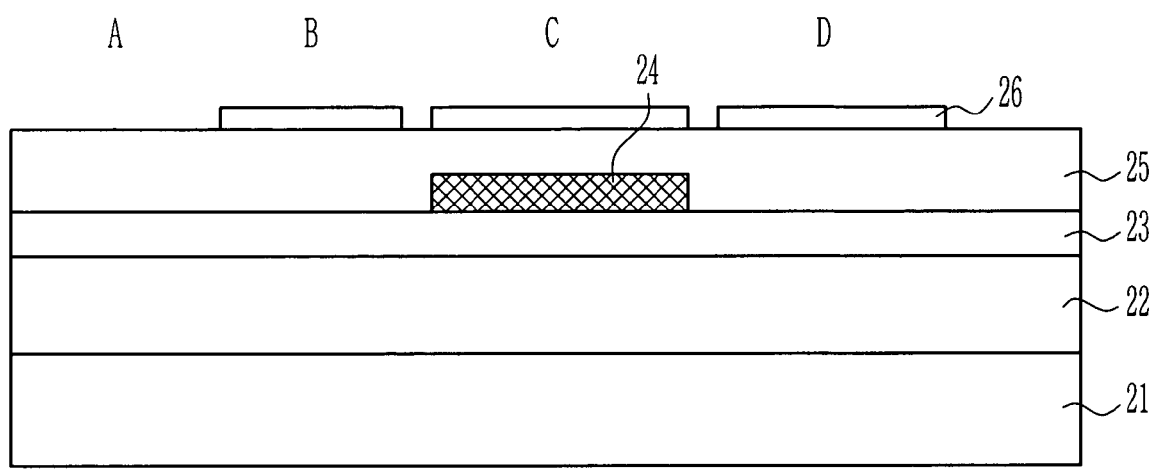
Figure 10B:
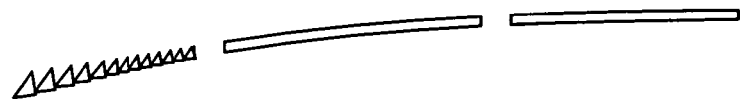

Referring to FIGS. 10A and 10B, the Fabry-Perot filter area A, the electrode array area B, the active area C, and the phase control area D are separated from each other by the isolation process. FIG. 10B shows the mask pattern upon performing this process. The electrode array area B is formed with a triangle shape.

Figure 11:
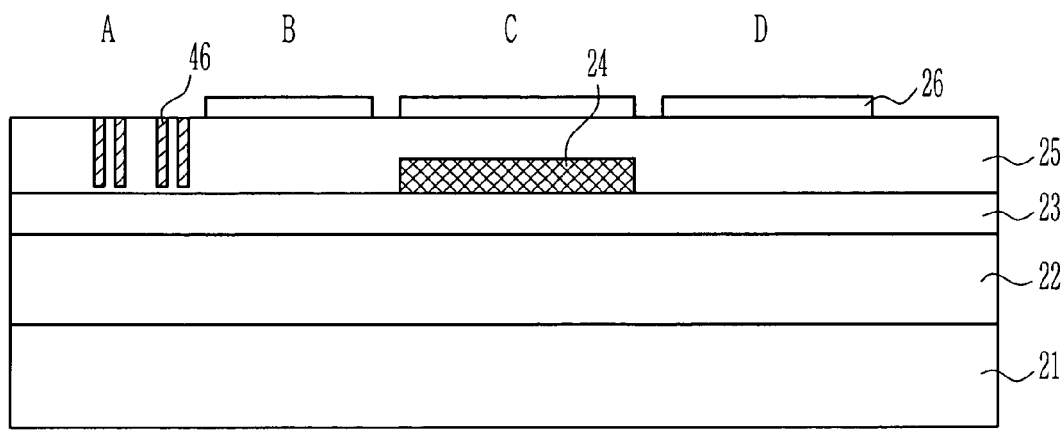

Referring to FIG. 11, the Fabry-Perot filter 44 is formed by periodically engraving the grooves having a specific width in the waveguide 23 and filling them with the material 46 having the refractive index different from that of the core or cladding, as mentioned above. The fine patterning process can be performed by using holography lithography.

Figure 12:
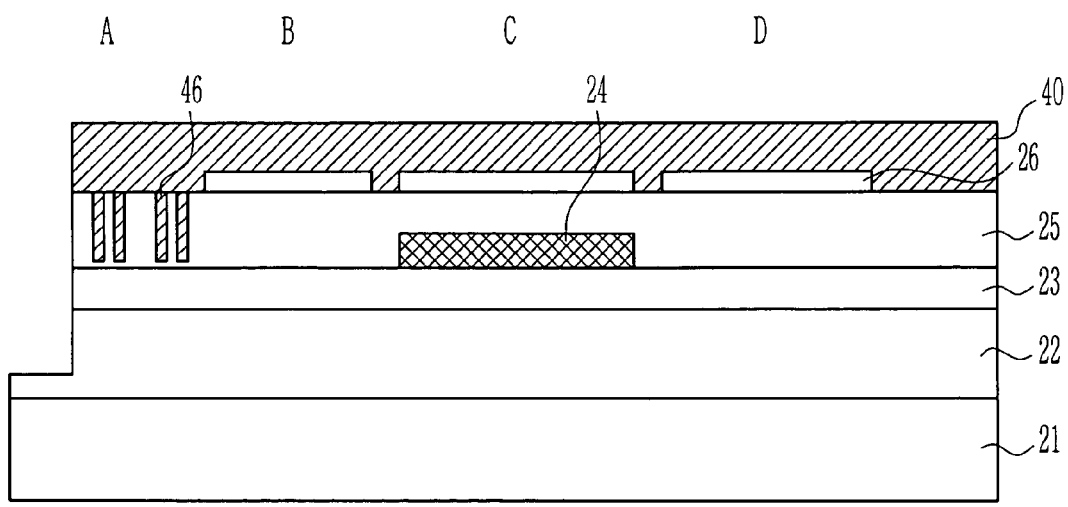

Referring to FIG. 12, the curved mirror 47 having the section shown in FIG. 6 can be formed on the waveguide 23 by the lithography and etching process using the etch-preventing film 40 as a mask. The curved mirror 47 can have the gold film or multi-layer of dielectric material at the edge. In addition, the depth of the curved mirror 47 is not specificaly likited and can be deep to the buffer layer 22, the core layer 23, or the cladding layer 24.

Figure 13A:
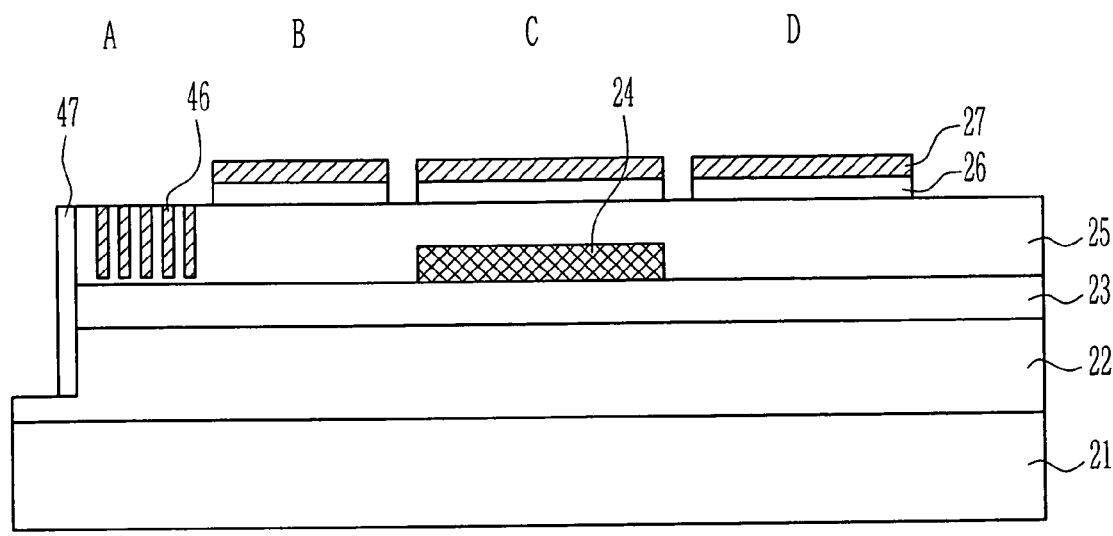
Figure 13B:
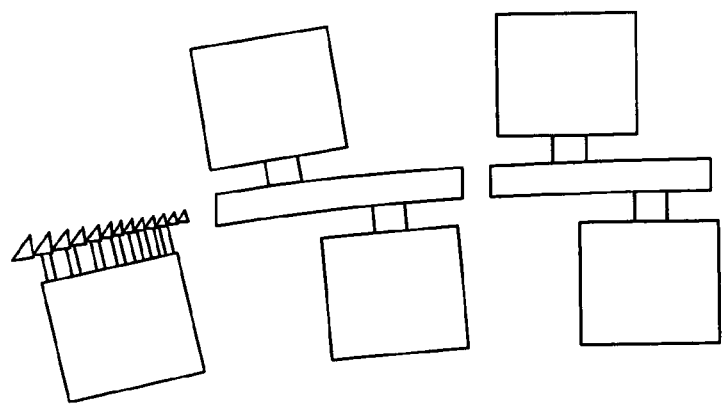

Referring to FIGS. 13A and 13B, the electrodes are formed on an appropriate position of the structure. FIG. 13B shows the pattern mask for foming the electrode. The electrodes are fomed on the electrode array area B, the active area C, and the phase control area D as shown in FIG. 13a. As the electrode materials, Pi/Pt/Au films may be deposited by thickness of 200/200/3000 Å to form the metal electrode 27.

Accordingly, as mentioned above, the present invention can accomplish the above-mentioned objects. That is, the tuning successively accomplished over the wide wavelength band. High output powers and fast tuning time can also be expected.

Although the present invention has been illustrated and described with respect to exemplary embodiments thereof, the present invention should not be understood as limited to the specific embodiment, and it should be understood by those skilled in the art that the foregoing and various other changes, omission and additions may be made therein and thereto, without departing from the spirit and scope of the present invention.

What is claimed is:

1. A tunable semiconductor laser, comprising:
    a curve-shaped waveguide formed on a substrate for guiding light beam;
    an active area formed on a portion of said waveguide for generating the light beam;
    an electrode array formed at one side of said waveguide for changing the propagation direction of the light beam transmitted through said waveguide by applying electric field or currents to a predetermined portion of said waveguide;
    a Fabry-Perot filter for filtering only the light beam having one wavelength selected according to the change of the propagation direction of said light beam; and
    a curved mirror for reflecting the light beam having said wavelength passed through said Fabry-Perot filter.

2. The tunable semiconductor laser according to claim 1, wherein an electrode in said electrode array has an incident angle and an emergent angle of the propagated wave different from each other, and the inside of said electrode has a refractive index different from that of the outside thereof by applying the electric field or currents.

3. The tunable semiconductor laser according to claim 2, wherein said electrode of the electrode array has triangular or trapezoidal shape.

4. The tunable semiconductor laser according to claim 1, further comprising an output mirror formed at the other side of said active area for outputting the light beam transmitted from said waveguide.

5. The tunable semiconductor laser according to claim 4, wherein said output mirror has a uniform grating engraved in the curved waveguide or a chirped grating engraved in a straight waveguide.

6. The tunable semiconductor laser according to claim 1, further comprising an antireflection thin film between a facet of semiconductor and said Fabry-Perot filter.

7. The tunable semiconductor laser according to claim 1, further comprising a phase controller area formed at the other side of said active area.

8. The tunable semiconductor laser according to claim 1, wherein said curved mirror is coated with reflection material.

9. The tunable semiconductor laser according to claim 1, wherein said waveguide is bended such that the light beam reflected from said Fabry-Perot filter escapes out of said waveguide.

10. The tunable semiconductor laser according to claim 1, wherein said Fabry-Perot filter is mounted on one facet of said semiconductor laser.

11. The tunable semiconductor laser according to claim 10, wherein said Fabry-Perot filter is formed of $TiO_2/SiO_2$ or $SiN_x/SiO_2$ thin films.

12. The tunable semiconductor laser according to claim 10, wherein said curved mirror is formed on said Fabry-Perot filter.

13. The tunable semiconductor laser according to claim 1, wherein said Fabry-Perot filter has a cavity structure comprised of said cladding layer and a dielectric material having a refractive index different from that of said cladding layer.

14. The tunable semiconductor laser according to claim 13, wherein said dielectric material is a silicon nitride film.

15. The tunable semiconductor laser according to claim 13, wherein said curved mirror is formed with metal or dielectric material on an edge of said Fabry-Perot filter so as to reflect the light beam transmitted through said Fabry-Perot filter.

* * * * *